US012742817B2

(12) United States Patent
Park

(10) Patent No.: US 12,742,817 B2
(45) Date of Patent: Sep. 22, 2026

(54) SEMICONDUCTOR DEVICE AND SEMICONDUCTOR PACKAGE

(71) Applicant: SAMSUNG ELECTRONICS CO., LTD., Suwon-si (KR)

(72) Inventor: Donguk Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 196 days.

(21) Appl. No.: 18/658,529

(22) Filed: May 8, 2024

(65) Prior Publication Data

US 2025/0093410 A1 Mar. 20, 2025

(30) Foreign Application Priority Data

Sep. 14, 2023 (KR) ........................ 10-2023-0122321

(51) Int. Cl.
*G01R 31/28* (2006.01)
*H10W 70/60* (2026.01)
*H10W 70/65* (2026.01)
*H10W 90/00* (2026.01)

(52) U.S. Cl.
CPC ....... *G01R 31/2884* (2013.01); *H10W 70/611* (2026.01); *H10W 70/65* (2026.01); *H10W 90/00* (2026.01); *H10W 90/724* (2026.01)

(58) Field of Classification Search
CPC .......................... G01R 31/2884; H10W 90/00; H10W 90/724; H10W 70/65; H10W 70/611
See application file for complete search history.

(56) References Cited

U.S. PATENT DOCUMENTS

| | | | |
|---|---|---|---|
| 6,876,218 B1 | 4/2005 | Simmons et al. | |
| 7,036,055 B2 | 4/2006 | Muljono et al. | |
| 8,994,404 B1 | 3/2015 | Or-Bach et al. | |
| 2004/0128601 A1* | 7/2004 | Muljono .............. | G11C 29/022 714/734 |

(Continued)

FOREIGN PATENT DOCUMENTS

| | | |
|---|---|---|
| KR | 10-2019-0000663 A | 1/2019 |
| KR | 10-2023-0003545 A | 1/2023 |
| WO | 2021/214562 A1 | 10/2021 |

OTHER PUBLICATIONS

Communication dated Nov. 13, 2024, issued by European Patent Office in European Patent Application No. 24181152.0.

*Primary Examiner* — Stephanie E Bloss
*Assistant Examiner* — Michael A Harrison
(74) *Attorney, Agent, or Firm* — Sughrue Mion, PLLC

(57) ABSTRACT

Provided is a semiconductor device including a first transmission pad configured to output a data signal; a second transmission pad configured to output a clock signal; a data transmission circuit connected to the first transmission pad and comprising a data driver configured to generate the data signal; a clock transmission circuit connected to the second transmission pad and comprising a clock driver configured to generate the clock signal; a core circuit configured to control the data driver and the clock driver; and at least one buffer, wherein each buffer of the at least one buffer comprises: an input terminal connected to at least one of an output terminal of the data driver and an output terminal of the clock driver; and an output terminal connected to the core circuit.

20 Claims, 18 Drawing Sheets

(56) References Cited

U.S. PATENT DOCUMENTS

| | | | | |
|---|---|---|---|---|
| 2013/0088624 | A1* | 4/2013 | Mo | H04N 25/78 348/308 |
| 2013/0106463 | A1 | 5/2013 | Chi | |
| 2016/0025807 | A1* | 1/2016 | Loke | G01R 31/31716 714/731 |
| 2018/0374555 | A1 | 12/2018 | Kwon et al. | |
| 2019/0096503 | A1 | 3/2019 | Chakravarty et al. | |
| 2020/0116783 | A1 | 4/2020 | Kalva et al. | |
| 2021/0333326 | A1 | 10/2021 | Wang | |
| 2022/0318111 | A1 | 10/2022 | Choudhary et al. | |

* cited by examiner

SEMICONDUCTOR DEVICE AND SEMICONDUCTOR PACKAGE

CROSS-REFERENCE TO RELATED APPLICATIONS

This application claims the benefit under 35 USC 119(a) of Korean Patent Application No. 10-2023-0122321, filed on Sep. 14, 2023, in the Korean Intellectual Property Office, the entire disclosure of which is incorporated herein by reference for all purposes.

BACKGROUND

1. Field

The present disclosure relates to a semiconductor device and a semiconductor package.

2. Description of Related Art

Instead of implementing multiple ICs executing different functions in one semiconductor device, a method of implementing a high-performance computing device by including multiple semiconductor devices in one semiconductor package has been proposed. The plurality of respective semiconductor devices included in the semiconductor package are mounted on one substrate and connected to each other by a redistribution pattern included in the substrate, and may operate by exchanging data signals and clock signals. However, as the size of bumps connecting the semiconductor device to the substrate decreases, it may not be possible to sufficiently test the semiconductor device at the wafer level. As a result, problems such as reduced yield of semiconductor packages and increased manufacturing costs may occur.

SUMMARY

The disclosure provides a semiconductor device and a semiconductor package, in which a built-in self-test may be effectively performed at a wafer level, by connecting a buffer between a pad and an output terminal of a transmission circuit outputting a data signal and/or a clock signal and by forcibly setting an output of a sense amplifier to a specific value using an offset cancellation function of the sense amplifier included in a reception circuit.

According to an aspect of the disclosure, a semiconductor device includes: a first transmission pad configured to output a data signal; a second transmission pad configured to output a clock signal; a data transmission circuit connected to the first transmission pad and including a data driver configured to generate the data signal; a clock transmission circuit connected to the second transmission pad and including a clock driver configured to generate the clock signal; a core circuit configured to control the data driver and the clock driver; and at least one buffer, wherein each buffer of the at least one buffer includes: an input terminal connected to at least one of an output terminal of the data driver and an output terminal of the clock driver; and an output terminal connected to the core circuit.

According to an aspect of the disclosure, a semiconductor package includes: a first semiconductor device including a first transmission pad configured to output a data signal and a second transmission pad configured to output a clock signal; a second semiconductor device including a first reception pad configured to receive the data signal and a second reception pad configured to receive the clock signal; an intermediate substrate on which the first semiconductor device and the second semiconductor device are mounted, wherein the intermediate substrate includes a redistribution pattern connecting the first transmission pad with the first reception pad and connecting the second transmission pad with the second reception pad; and a package substrate on which the intermediate substrate is mounted, wherein the first semiconductor device includes: a first switch element connected between an output terminal of a data driver configured to output the data signal and the first transmission pad; and a first buffer connected to the first switch element.

According to an aspect of the disclosure, a semiconductor device includes: a reception pad configured to receive a data signal; a sense amplifier including a first input terminal connected to the reception pad, a second input terminal configured to receive a predetermined reference voltage, an offset cancellation switch connected between the first input terminal and the second input terminal, and an offset cancellation circuit connected to at least one of the first input terminal and the second input terminal; and a core circuit configured to: control the offset cancellation switch, control the offset cancellation circuit to output a first offset cancellation code and a second offset cancellation code, turn on the offset cancellation switch with the reception pad in a floating state, set one of the first offset cancellation code and the second offset cancellation code to a maximum value and set the other one of the first offset cancellation code and the second offset cancellation code to a minimum value, and identify whether the sense amplifier is defective.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
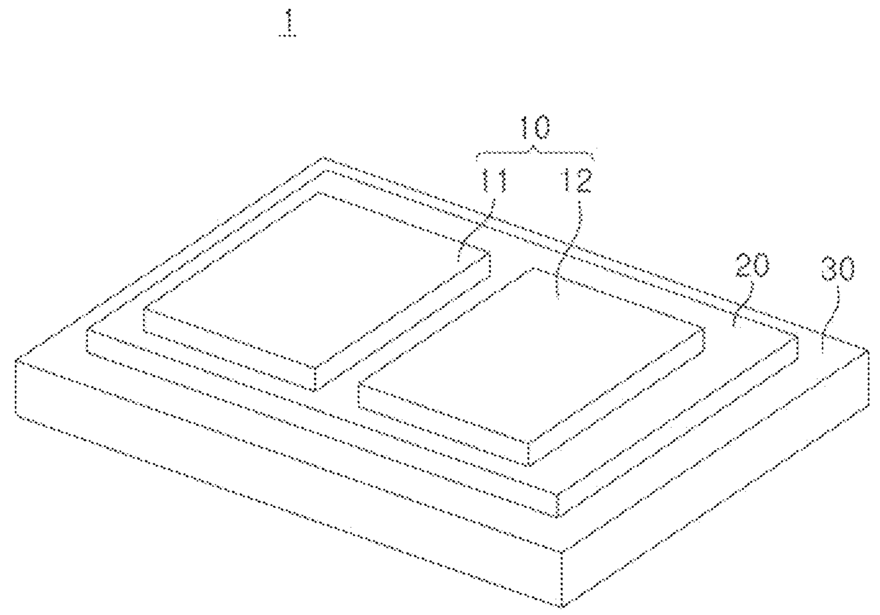
FIGS. 1 and 2 are schematic diagrams of a semiconductor package according to an example embodiment.

Hereinafter, example embodiments will be described with reference to the accompanying drawings.

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expressions "at least one of a, b or c" and "at least one of a, b and c" indicate "only a," "only b," "only c," "both a and b," "both a and c," "both b and c," and "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

Figure 2:
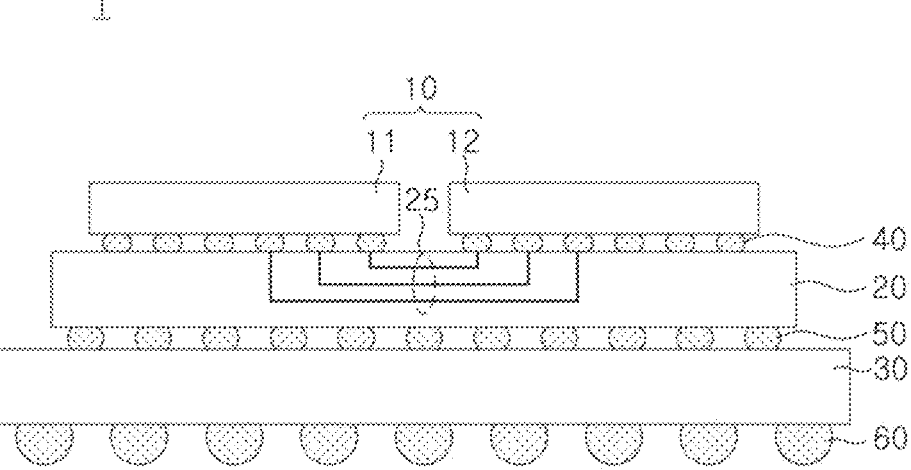

FIGS. 1 and 2 are schematic diagrams of a semiconductor package according to an example embodiment.

Referring to FIGS. 1 and 2, a semiconductor package 1 according to an example embodiment may include a plurality of semiconductor devices 10, a silicon interposer 20, a package substrate 30, and the like. The plurality of semiconductor devices 10 are mounted on the silicon interposer 20, and the number of semiconductor devices 10 included in the semiconductor package 1 may vary depending on an example embodiment.

A first semiconductor device 11 and a second semiconductor device 12 may respectively be a central processing unit (CPU), a graphics processing unit (GPU), an application processor (AP), an application specific integrated circuit (ASIC), or the like. Depending on an example embodiment, the semiconductor package 1 may include at least one memory device mounted on the silicon interposer 20, and the memory device may include a plurality of memory chips stacked in a direction perpendicular to an upper surface of the silicon interposer 20. The plurality of memory chips stacked together may be connected to each other by through silicon vias, or the like Referring to FIG. 2, the first semiconductor device 11 and the second semiconductor device 12 may be electrically connected to each other through a redistribution pattern 25 disposed within the silicon interposer 20. The first semiconductor device 11 and the second semiconductor device 12 may operate by exchanging data signals, command signals, clock signals, or the like with each other through the redistribution pattern 25.

Each of the first semiconductor device 11 and the second semiconductor device 12 may be mounted on the silicon interposer 20 by a plurality of microbumps 40. Alternatively, the silicon interposer 20 may be mounted on the package substrate 30 by a plurality of bumps 50. Solder balls 60 are formed on the bottom of the package substrate 30 for connection to other semiconductor packages, or the like, and the semiconductor package 1 may exchange signals with other semiconductor packages or receive power voltage required for operation via the solder balls 60.

The size of the plurality of microbumps 40 that combine each of the first semiconductor device 11 and the second semiconductor device 12 with the silicon interposer 20 may be smaller than the size of the plurality of bumps 50 and solder balls 60. For example, the diameter of each of the plurality of microbumps 40 may be tens of micrometers, and depending on an example embodiment, may be 50 micrometers or less. Therefore, the integration of the redistribution pattern 25 included in the silicon interposer 20 may be increased and a high-performance semiconductor package 1 may be implemented.

However, since microbumps 40, having relatively small diameters, are formed in each of the semiconductor devices 10, wafer-level testing performed by contacting each of the microbumps 40 with a probe device may not be possible. For example, in each of the semiconductor devices 10, the transmission and reception circuits that exchange signals with other external devices have not been tested at the wafer level. Semiconductor devices 10 may be mounted on the silicon interposer 20. Accordingly, if a defect occurs in one of the semiconductor devices 10 after being mounted on the silicon interposer 20, the entire semiconductor package 1 may have to be discarded or the packaging process may have to be performed again.

In an example embodiment, a method is proposed to test each of the semiconductor devices 10 in which microbumps 40 with a diameter of several tens of micrometers are formed at the wafer level. For example, each of the semiconductor devices 10 may connect a switch element and a buffer between the driver of the transmission circuit and the transmission pad, and the output terminal of the buffer may be connected to the core circuit.

Before proceeding with the scribing process of separating the semiconductor devices 10 from the wafer, a power supply voltage and a command signal instructing execution of a test operation may be input through test pads provided on each of the semiconductor devices 10. The test pad is combined with the plurality of microbumps 40 and has a relatively large size compared to the pads involved in the actual operation of each of the semiconductor devices 10, and thus may be contacted with the probe device.

Each of the semiconductor devices 10 may perform a self-test at the wafer level using a power supply voltage and a command signal input through test pads. For example, the driver outputting the data signal is set to continuously output a voltage corresponding to "0" (i.e., digital "0") or a voltage corresponding to "1" (i.e., digital "1"), and the core circuit may detect the output of the buffer connected between the output terminal of the driver and the transmission pad to check whether the driver is defective. Therefore, each of the semiconductor devices 10 may be tested before the packaging process, improving the yield of the semiconductor package 1 and lowering the manufacturing cost.

Figure 3:
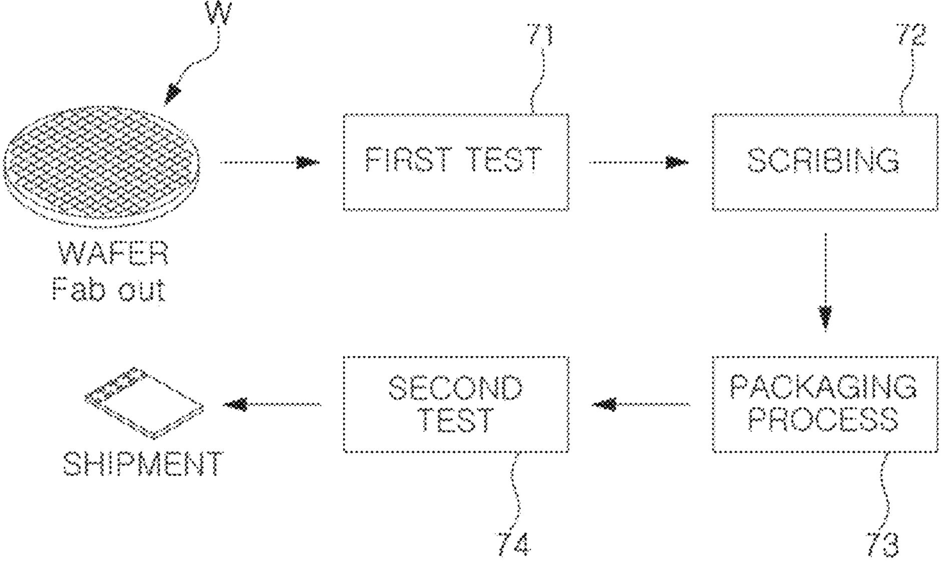
FIG. 3 is a diagram illustrating a method of manufacturing a semiconductor package according to an example embodiment.

FIG. 3 is a diagram illustrating a method of manufacturing a semiconductor package according to an example embodiment.

Referring to FIG. 3, a plurality of semiconductor dies are produced by applying semiconductor processes to the wafer W, and the wafer W may be fab-out. In an example embodiment, a plurality of semiconductor dies included in the wafer W may be at least one of the first semiconductor device 11 and the second semiconductor device 12 included in the semiconductor package 1 according to the example embodiment previously described with reference to FIGS. 1 and 2.

When the wafer W is fab-out, the first test 71 for each of the plurality of semiconductor dies may be performed at the wafer level. Each of the plurality of semiconductor dies may include a plurality of pads and a plurality of test pads, and a plurality of microbumps may be connected to the plurality of pads. The test pad has a relatively larger area than the pad, and thus the power supply voltage and command signal may be applied to the semiconductor die by contacting the probe device with the test pad.

The semiconductor die may perform the first test 71 in a self-test manner in response to the command signal. For example, while a self-test is in progress, the core circuit of the semiconductor die may generate data of a specific pattern and use the data to conduct testing. Once the first test 71 is completed, the scribing process 72 and the packaging process 73 that separate the semiconductor dies from each other may proceed.

In an example embodiment, the semiconductor die may be configured to test the transmission circuit and reception circuit that input and output signals in the first test 71. For example, a buffer may be connected between the pad and the output terminal of a driver outputting a data signal and/or a clock signal. The buffer may provide a feedback path that transmits the signal output by the driver back to the core circuit. The core circuit of the semiconductor die may set the driver to output data of a predetermined pattern in response to a command signal received from a probe device in contact with the test pad, and compare the signal output by the driver with the data through the buffer, thereby executing the first test 71.

Additionally, in the first test 71, the core circuit may test the reception circuit. For example, the core circuit may activate the offset cancellation function of the sense amplifier included in the reception circuit in response to a command signal received from a probe device in contact with the test pad. With the offset cancellation function activated, the core circuit may set one of the offset cancellation code and the second offset cancellation code input to the sense amplifier to the maximum value and the other one to the minimum value, and may detect whether the output voltage of the sense amplifier is maintained at a level corresponding to a specific logic value. Therefore, even a circuit that transmits a signal to the outside of the semiconductor die or receives a signal from the outside may be verified in the first test 71.

In the packaging process 73, a plurality of semiconductor dies are mounted on an intermediate substrate such as a silicon interposer, and the intermediate substrate may be mounted on the package substrate. Depending on an example embodiment, the intermediate substrate may be inserted into a groove formed on the upper surface of the package substrate. In this case, some of the pads formed on each of the plurality of semiconductor dies may be coupled to the intermediate substrate, and the rest are directly coupled to the package substrate. Once the packaging process 73 is completed, the second test 74 may proceed. The second test 74 may be a test process executed at the package level, and may be executed by a power supply voltage and a command signal applied through solder balls formed on the package substrate and exposed to the outside.

Figure 4:
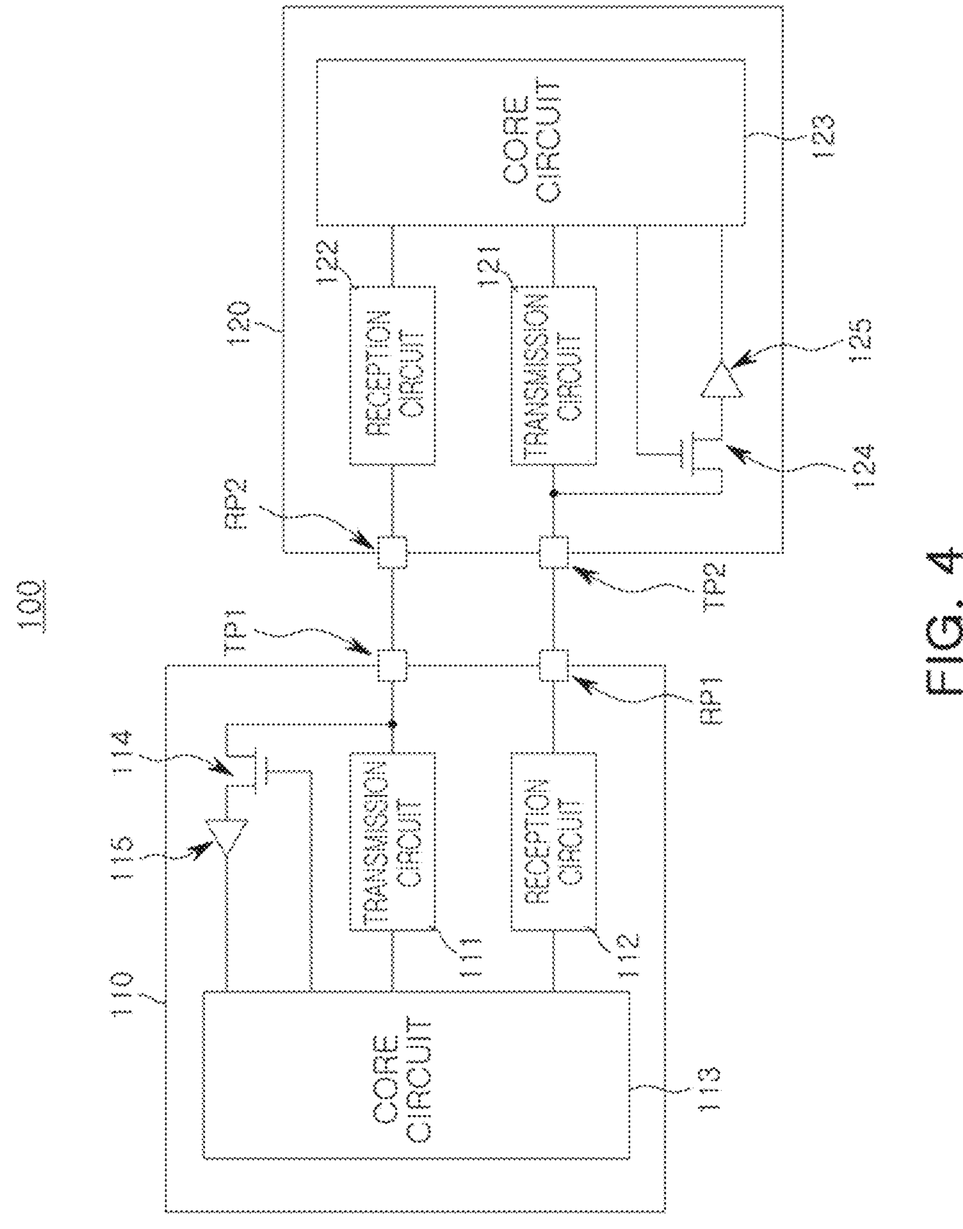
FIG. 4 is a block diagram schematically illustrating a semiconductor package according to an example embodiment.

FIG. 4 is a block diagram schematically illustrating a semiconductor package according to an example embodiment.

Referring to FIG. 4, a semiconductor package 100 according to an example embodiment may include a first semiconductor device 110 and a second semiconductor device 120. Each of the first semiconductor device 110 and the second semiconductor device 120 may include at least one of various devices such as a central processing unit, a graphics processing unit, an application processor, an application-specific semiconductor, a modem, and a memory device. In an example embodiment illustrated in FIG. 4, it is assumed that the first semiconductor device 110 and the second semiconductor device 120 are devices have similar structures. Alternatively, the first semiconductor device 110 and the second semiconductor device 120 may have different structures.

Within the semiconductor package 100, the first semiconductor device 110 and the second semiconductor device 120 may operate by exchanging signals with each other. The receiving path may be provided by a wiring pattern in the substrate on which the first semiconductor device 110 and the second semiconductor device 120 are mounted. For example, the first semiconductor device 110 and the second semiconductor device 120 may be mounted on a silicon interposer.

The first semiconductor device 110 may include a transmission circuit 111, a reception circuit 112, a core circuit 113, and the like. The transmission circuit 111 may output a signal to the outside through the first transmission pad TP1, and the reception circuit 112 may receive a signal from the outside through the first reception pad RP1. In an example embodiment illustrated in FIG. 4, the first transmission pad TP1 may be connected to the second reception pad RP2 of the second semiconductor device 120, and the first reception pad RP1 may be connected to the second transmission pad TP2 of the second semiconductor device 120.

The second semiconductor device 120 may include a transmission circuit 121, a reception circuit 122, a core circuit 123, and the like. The transmission circuit 121 may transmit a data signal, a clock signal, and the like to the first semiconductor device 110 through the second transmission pad TP2, and the reception circuit 122 may transmit the first signal to the first semiconductor device 110 through the second reception pad RP2. Data signals, clock signals, or the like may be received from the semiconductor device 110.

Each of the first semiconductor device 110 and the second semiconductor device 120 may include buffers 115 and 125 connected to the transmission pads TP1 and TP2 through switch elements 114 and 124. The buffers 115 and 125 may provide a feedback path through which signals output to the transmission pads TP1 and TP2 are re-input to the core circuits 113 and 123.

The switch elements 114 and 124 may be turned on when testing is performed in a state in which the first semiconductor device 110 and the second semiconductor device 120 are not connected to each other, for example, in a wafer level state. For example, when the first semiconductor device 110 is in a state before being separated from the wafer and a power voltage and a command signal for test execution are input at a test pad different from the first transmission pad TP1 and the first reception pad RP1, the core circuit 113 may turn on the switch element 114 in response to the command signal.

Accordingly, the signal output by the transmission circuit 111 may be fed back to the core circuit 113 through the switch element 114 and the buffer 115, instead of being output to the first transmission pad TP1 in a floating state. Since the signal output by the transmission circuit 111 is also determined by the core circuit 113, the core circuit 113 compares the signal to be output to the transmission circuit 111 with the signal fed back through the buffer 115. Whether the transmission circuit 111 is operating normally may be verified. The second semiconductor device 120 may also test the transmission circuit 121 in a similar manner.

The reception circuits 112 and 122 may include a sense amplifier depending on the type of signal being received and the transmission speed of the signal. The core circuits 113 and 123 of each of the first semiconductor device 110 and the second semiconductor device 120 may perform a self-test at the wafer level for the reception circuits 112 and 122 including a sense amplifier.

For example, the core circuits 113 and 123 may activate the offset cancellation function of the sense amplifier and set the offset cancellation code input to the sense amplifier to the maximum or minimum value. As the offset cancellation code is set to the maximum or minimum value, the sense amplifier continuously outputs a voltage corresponding to digital "0" or a voltage corresponding to digital "1" while the reception pads RP1 and RP2 are floating. The core circuits 113 and 123 may verify the reception circuits 112 and 122 including the sense amplifier by comparing the output predicted, according to the setting of the offset cancellation code, with the actual output of the sense amplifier.

As such, in an example embodiment, even when the transmission pads TP1 and TP2 and the reception pads RP1 and RP2 are floating, the operation of the sense amplifier operating as a driver outputting a signal and a receiver receiving the signal may be tested. Therefore, the yield of the semiconductor package 100 may be improved and the manufacturing cost may be reduced by only including semiconductor devices 110 and 120 that are judged to be good products in the manufacturing of the semiconductor package 100.

Figure 5:
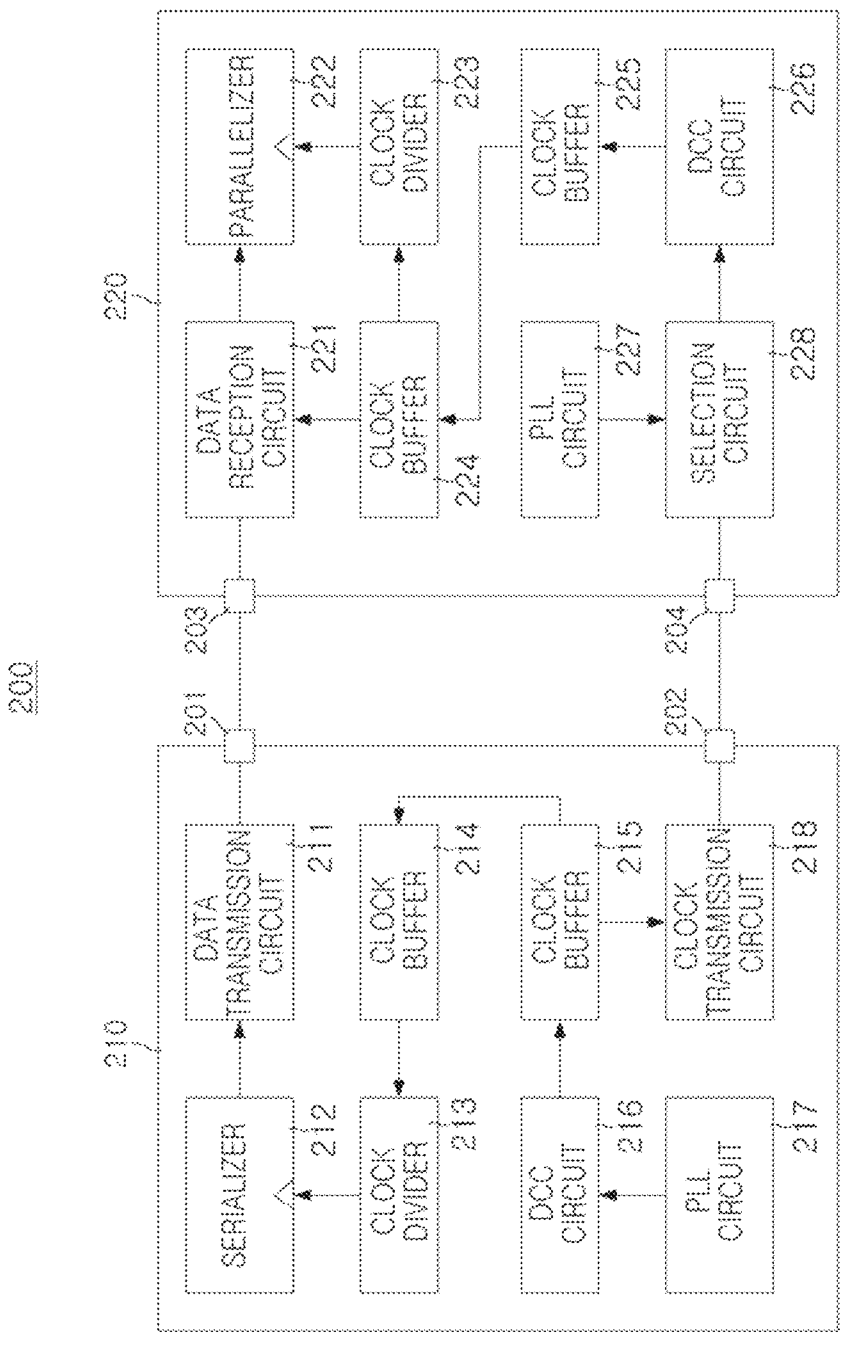
FIGS. 5, 6, and 7 are diagrams illustrating a method of testing a semiconductor package according to an example embodiment.
Figure 6:
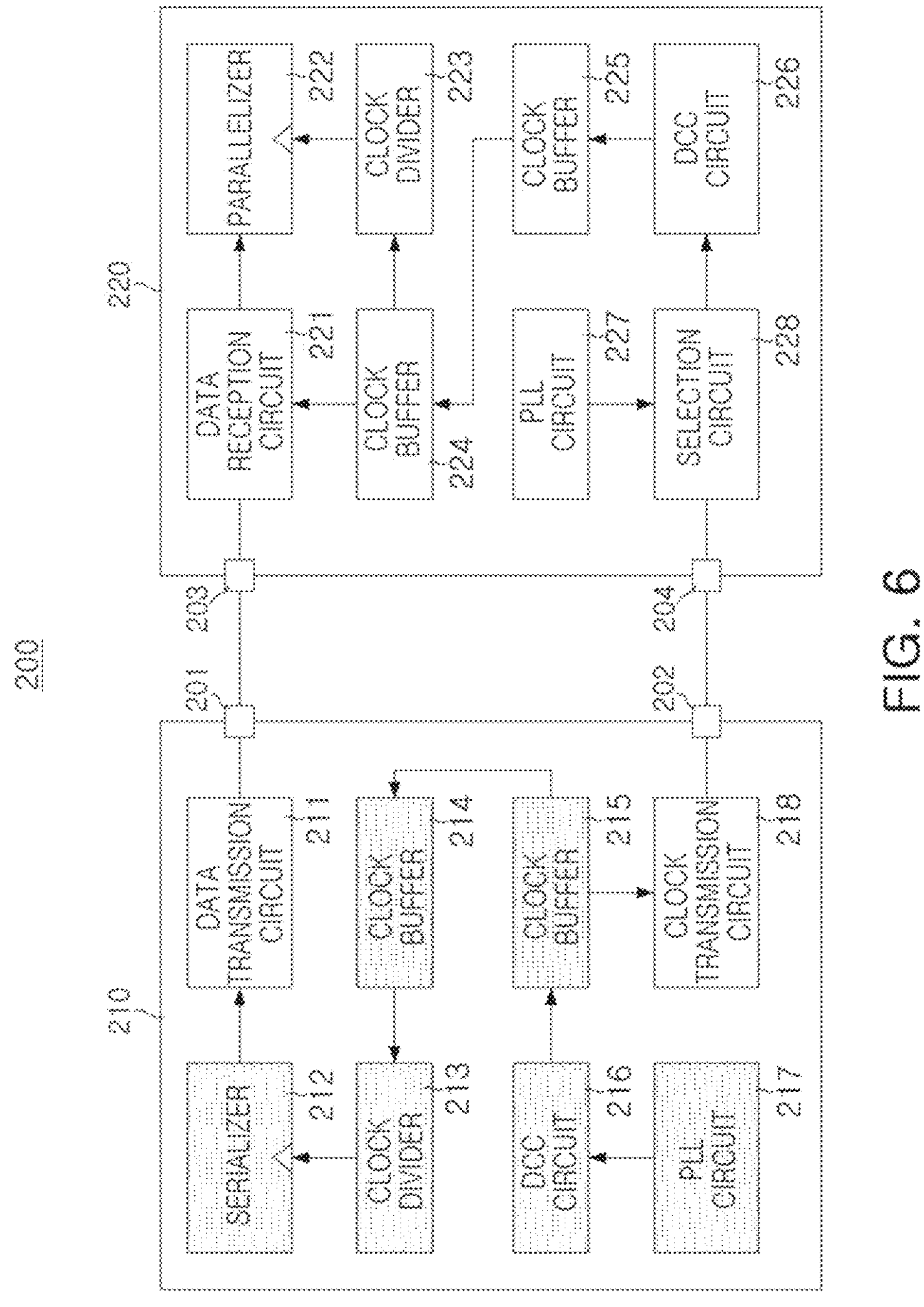
Figure 7:
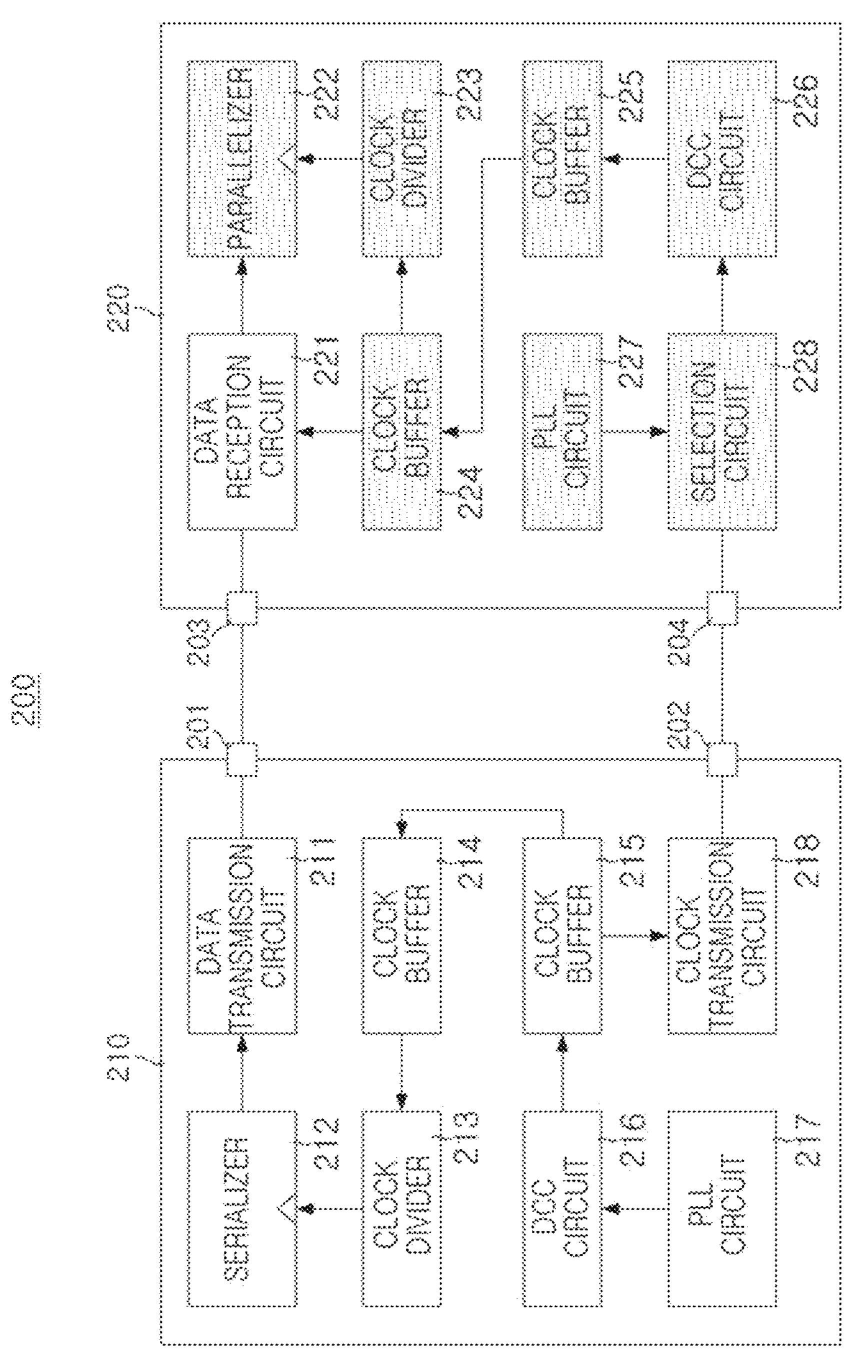

FIGS. 5 to 7 are drawings illustrating a method of testing a semiconductor package according to an example embodiment.

Referring to FIG. 5, a semiconductor package 200 according to an example embodiment may include a first semiconductor device 210 and a second semiconductor device 220. The first transmission pad 201 of the first semiconductor device 210 is connected to the first reception pad 203 of the second semiconductor device 220, and the second transmission pad 202 of the first semiconductor device 210 may be connected to the second reception pad 204 of the second semiconductor device 220. A data signal may be transmitted between the first transmission pad 201 and the first reception pad 203, and a clock signal may be transmitted between the second transmission pad 202 and the second reception pad 204.

The first semiconductor device 210 may include a data transmission circuit 211, a serializer 212, a clock divider 213, clock buffers 214 and 215, a duty cycle correction (DCC) circuit 216, a Phase Locked Loop (PLL) circuit 217, a clock transmission circuit 218, and the like. The second semiconductor device 220 may include a data reception circuit 221, a parallelizer 222, a clock divider 223, clock buffers 224 and 225, a DCC circuit 226, a PLL circuit 227, a selection circuit 228, and the like. However, the configuration of each of the first semiconductor device 210 and the second semiconductor device 220 may be modified in various ways depending on an example embodiment.

The serializer 212 may serialize data processed within the first semiconductor device 210 to generate a data signal. For example, the serializer 212 may serialize data in synchronization with the clock signal output by the clock divider 213. Depending on an example embodiment, the serializer 212 may include a 16:8 serializer, an 8:4 serializer, and the like, and in this case, clock signals having different frequencies may be input to the 16:8 serializer and the 8:4 serializer, respectively.

The data transmission circuit 211 may include a retimer, a serializer, and a driver that ultimately process the data signal. For example, assuming that the serializer 212 includes a 16:8 serializer and an 8:4 serializer as described above, the data transmission circuit 211 may include a 4:1 serializer. The serializer, retimer, and the like included in the data transmission circuit 211 may operate in synchronization with the clock signal output from the clock buffer 214.

The clock divider 213 may change the frequency of the clock signal received from the clock buffer 214 and input the same to the serializer 212. Depending on the frequency of the clock signal output by the clock divider 213, the transmission speed of the data signal input to the data transmission circuit 211 may vary.

The internal clock signal used to operate the first semiconductor device 210 may be generated in the PLL circuit 217. When the PLL circuit 217 generates an internal clock signal, the DCC circuit 216 may adjust the duty of the internal clock signal and transmit the same to the clock buffer 215. The clock buffer 215 may transmit a clock signal to the clock buffer 214 on the circuit that transmits the data signal, or may transmit the clock signal to the clock transmission circuit 218. The clock transmission circuit 218 includes a driver, and the clock signal output by the clock transmission circuit 218 may be provided to the second semiconductor device 220 as an external clock signal.

The second semiconductor device 220 may receive a data signal through the first reception pad 203 and an external clock signal through the second reception pad 204. However, the second semiconductor device 220 may also generate an internal clock signal in the PLL circuit 227, and the selection circuit 228 connected to the second reception pad 204 may select one of the internal clock signal and the external clock signal and transmit the signal to the DCC circuit 226. The DCC circuit 226 may adjust the duty ratio of the clock signal selected by the selection circuit 228 and output the same to the clock buffer 225. The clock buffer 225 may transmit a clock signal to the clock buffer 224 on the circuit side that receives the data signal.

The clock divider 223 may change the frequency of the clock signal output by the clock buffer 224 and input the frequency to the parallelizer 222, and the clock buffer 224 may also output a clock signal to the data reception circuit 221. The data reception circuit 221 may include a sense amplifier, a retimer, and the like that receive a data signal from the first semiconductor device 210 through the first reception pad 203. Depending on an example embodiment, a plurality of sense amplifiers may be connected in parallel to one first reception pad 203. The parallelizer 222 may be synchronized with the clock signal output from the clock divider 223 and may parallel process the data signal output from the data reception circuit 221.

In the semiconductor package 200 according to the example embodiment illustrated in FIG. 5, in the process of testing each of the first semiconductor device 210 and the second semiconductor device 220 at the wafer level, the transmission pads 201 and 202 and reception pads 203 and 204 may be floating. This may be because, as described above, the size of each of the plurality of microbumps included in each of the first semiconductor device 210 and the second semiconductor device 220 is small, and thus, it may be difficult to contact the probe device.

Therefore, at the wafer level where the transmission pads 201 and 202 and the reception pads 203 and 204 are not connected to each other, testing the data transmission circuit 211, clock transmission circuit 218, and data reception circuit 221 may be difficult. FIG. 6 is be a diagram illustrating a test operation of the first semiconductor device 210 performed at the wafer level. At the wafer level, the first semiconductor device 210 and the second semiconductor device 220 may not be connected to each other. Therefore, as illustrated in FIG. 6, even if the data transmission circuit 211 actually outputs a data signal or the clock transmission circuit 218 actually outputs a clock signal, since there is no circuit to receive data signals or clock signals, testing the data transmission circuit 211 and clock transmission circuit 218 may be difficult.

FIG. 7 is be a diagram illustrating a test operation of the second semiconductor device 220 performed at the wafer level. At the wafer level, the first semiconductor device 210 and the second semiconductor device 220 are not connected to each other and the probe device cannot be contacted with the reception pads 203 and 204, so as illustrated in FIG. 7, the data reception circuit 221 cannot actually receive the data signal. Accordingly, testing the sense amplifier included in the data reception circuit 221 may not be possible. However, by setting the selection circuit 228 to select the internal clock signal output by the PLL circuit 227, the circuit connected to the second reception pad 204 and receiving the clock signal may be tested at the wafer level.

Figure 8:
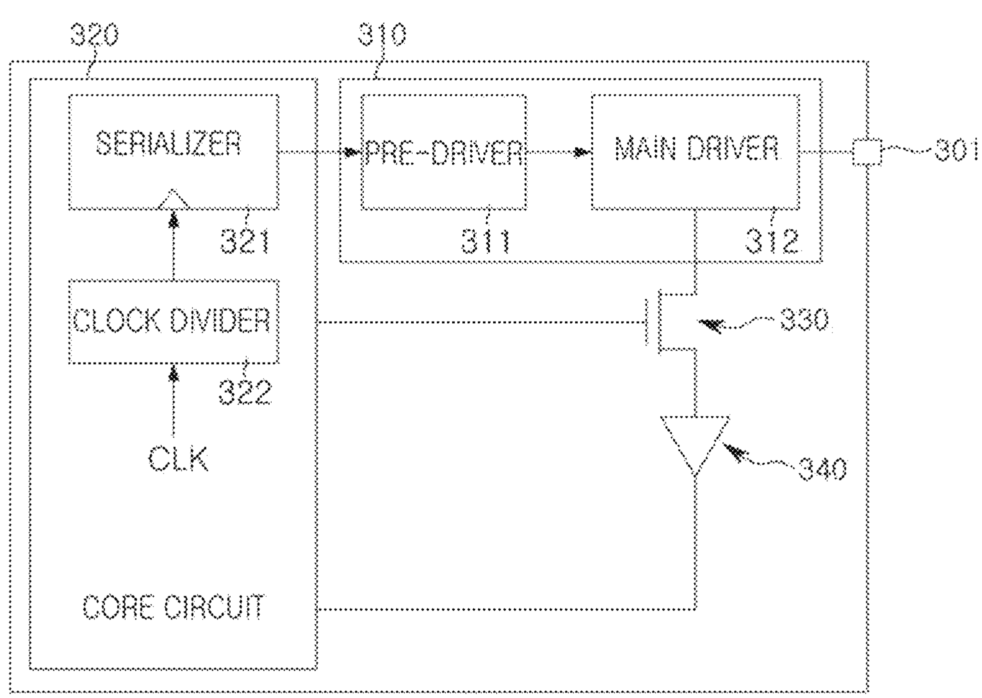
FIG. 8 is a schematic block diagram of a semiconductor device according to an example embodiment.

FIG. 8 is a schematic block diagram of a semiconductor device according to an example embodiment.

Referring to FIG. 8, the semiconductor device 300 according to an example embodiment may include a transmission pad 301, a data transmission circuit 310, a core circuit 320, and the like. FIG. 8 may be a diagram selectively illustrating some of the components included in the semiconductor device 300.

Referring to FIG. 8, the data transmission circuit 310 may include a pre-driver 311 and a main driver 312, and the output terminal of the main driver 312 may be directly connected to the transmission pad 301. The output terminal of the main driver 312 and the transmission pad 301 are also connected to the switch element 330, and the switch element 330 may be connected to the input terminal of the buffer 340. The output terminal of the buffer 340 may be connected to the core circuit 320.

The core circuit 320 may include a clock divider 322 and a serializer 321 that adjust the frequency of the clock signal CLK. The serializer 321 may serially process data processed in parallel within the core circuit 320 in synchronization with the rising edge and/or falling edge of the clock signal output by the clock divider 322.

Before the semiconductor device 300 is separated from the wafer, for example before the scribing process is performed, the transmission pad 301 may remain in a floating state. Therefore, when a command to perform a self-test is transmitted through the test pad of the semiconductor device 300, the core circuit 320 turns on the switch element 330 to verify the operation of the data transmission circuit 310. Hereinafter, operation of the semiconductor device will be described in more detail with reference to FIGS. 9 and 10.

Figure 9:
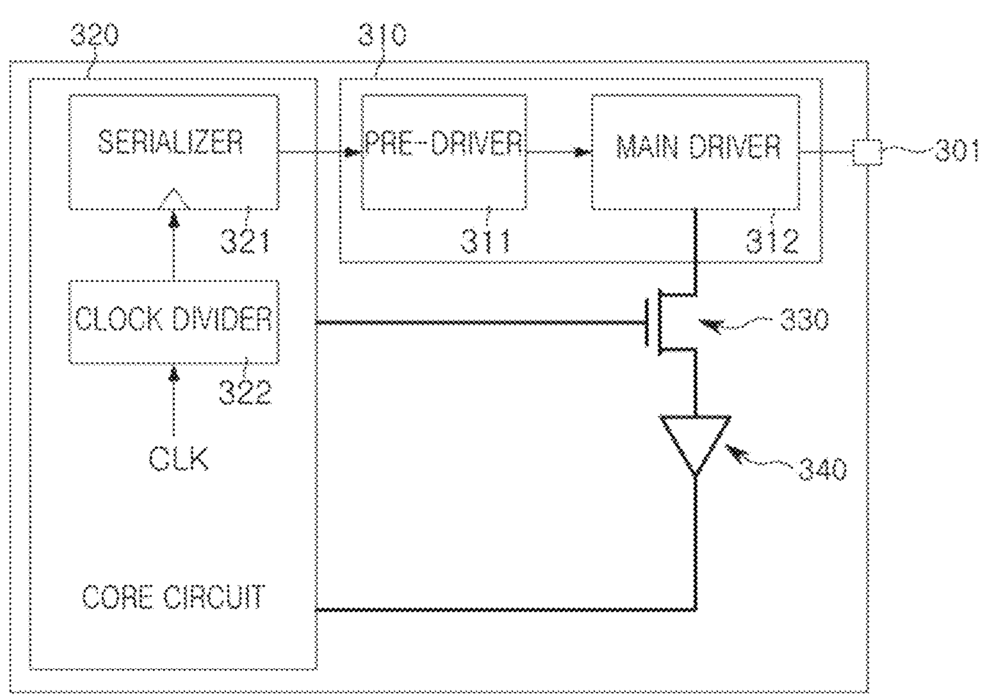
FIGS. 9 and 10 are diagrams illustrating the operation of a semiconductor device according to an example embodiment.
Figure 10:
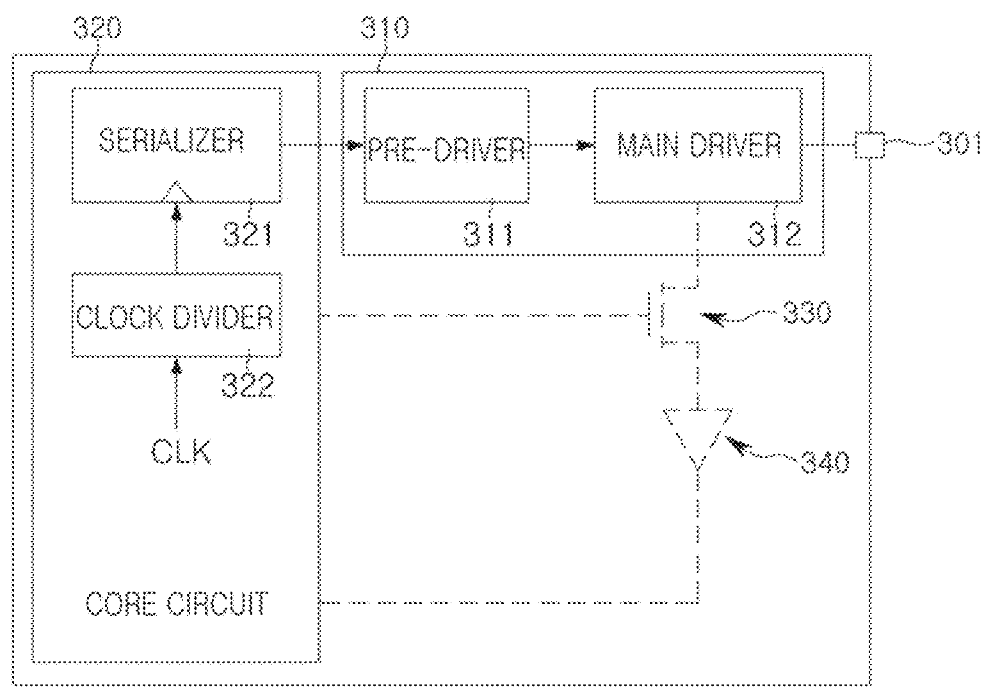

FIGS. 9 and 10 are drawings illustrating the operation of a semiconductor device according to an example embodiment.

First, FIG. 9 is a diagram illustrating the operation of the semiconductor device 300 while a test is in progress at the wafer level. Referring to FIG. 9, while testing is in progress at the wafer level, the core circuit 320 may set the serializer 321 to input only data "0" or "1" and turn on the switch element 330.

The data signal output from the data transmission circuit 310 to the transmission pad 301 may be a signal that swings between the first voltage level and the second voltage level. When only data "0" is set to be input to the serializer 321, the data signal may be maintained at the first voltage level. On the other hand, if only data "1" is set to be input to the serializer 321, the data signal may be maintained at the second voltage level.

The core circuit 320 may test the operation of the data transmission circuit 310 by comparing the signal output by the buffer 340 with data input to the serializer 321. In a state where only data "0" is set to be input to the serializer 321 and the buffer 340 continues to output a signal at the first voltage level, and when the buffer 340 continues to output a signal at the second voltage level while only data "1" is set to be input to the serializer 321, the core circuit 320 may determine that there is no defect in the data transmission circuit 310. The results determined by the core circuit 320 may be output through a probe device in contact with a test pad having an area larger than the transmission pad 301.

On the other hand, when the buffer 340 is set to input only data "0" to the serializer 321 and the buffer 340 outputs a signal at the second voltage level, or the buffer 340 is set to input only data "1" to the serializer 321, the buffer 340 outputs a signal at the first voltage level, the core circuit 320 may determine that a defect exists in the data transmission circuit 310. In this case, the semiconductor device 300 may not be input into the packaging process for producing a semiconductor package, and as a result, the yield and manufacturing cost of the semiconductor package may be improved.

FIG. 10 is a diagram illustrating a test performed at the package level after the semiconductor device 300 is determined to be a good product in a wafer level test and is mounted on a silicon interposer or the like in a semiconductor package. At the package level, the transmission pad of the semiconductor device 300 may be connected to the reception pad of another semiconductor device through a redistribution pattern such as a silicon interposer.

When testing at the package level begins, the core circuit 320 may control the serializer 321 to output test data of a predetermined pattern. At this time, the data output by the serializer 321 may not be selected as either "0" or "1," and for example, test data of a predetermined pattern may be input through a package board, or the like. The data transmission circuit 310 may output a data signal to another semiconductor device included in the semiconductor package through the transmission pad 301, and determine whether the data restored by the semiconductor device that received the data signal matches the test data. The semiconductor device 300 may be verified. Accordingly, as illustrated in FIG. 10, the switch element 330 is turned off, and the buffer 340 may not intervene in the operation of the semiconductor device 300.

Figure 11:
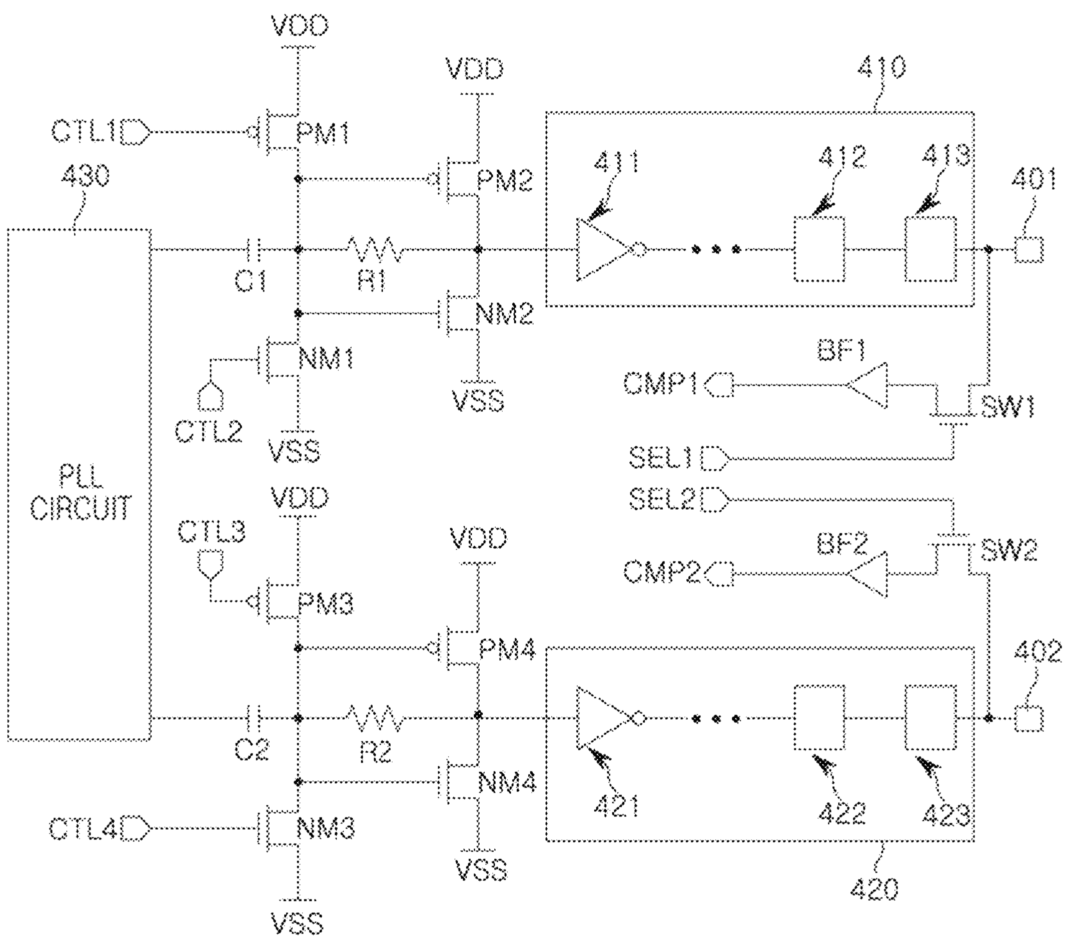
FIG. 11 is a diagram schematically illustrating a semiconductor device according to an example embodiment.

FIG. 11 is a diagram schematically illustrating a semiconductor device according to an example embodiment.

Referring to FIG. 11, the semiconductor device 400 according to an example embodiment may include a first clock transmission circuit 410, a second clock transmission circuit 420, and a PLL circuit 430. The first clock transmission circuit 410 may output a first clock signal to the first transmission pad 401, and the second clock transmission circuit 420 may output a second clock signal to the second transmission pad 402. For example, the first clock signal and the second clock signal are complementary signals and may have a phase difference of 180 degrees. However, depending on an example embodiment, the first clock signal and the second clock signal may have a phase difference of 90 degrees.

The clock signal output by the PLL circuit 430 may be respectively input to the first clock transmission circuit 410 and the second clock transmission circuit 420 through a DCC circuit. For example, the DCC circuit may include a plurality of elements NM1, NM2, PM1, PM2, R1 and C1 connected to the first clock transmission circuit 410, and a plurality of elements NM3, NM4, PM3, PM4, R2 and C2 connected to the second clock transmission circuit 420. Referring to FIG. 11, the source of each of the NMOS elements NM1-NM4 may be connected to a first power node that supplies the first power voltage VSS, and the source of each of the PMOS elements PM1-PM4 may be connected to a second power node that supplies the second power voltage VDD.

More specifically, the gate of the first PMOS device PM1 may receive the first control signal CTL1, and the gate of the first NMOS device NM1 may receive the second control signal CTL2. The third PMOS device PM3 may receive a third control signal CTL3, and the gate of the third NMOS device NM3 may receive a fourth control signal CTL4. The first to fourth control signals CTL1 to CTL4 may be signals output from the core circuit of the semiconductor device 400. The gate of the second PMOS device PM2 may be connected to the drain of the first PMOS device PM1, and the gate of the second NMOS device NM2 may be connected to the drain of the first NMOS device NM1. On the other hand, the gate of the fourth PMOS device PM4 may be connected to the drain of the third PMOS device PM3, and the gate of the fourth NMOS device NM4 may be connected to the drain of the third NMOS device NM3.

Each of the first clock transmission circuit 410 and the second clock transmission circuit 420 may include inverters 411 and 421, pre-drivers 412 and 422, and main drivers 413 and 423. Each of the first clock transmission circuit 410 and the second clock transmission circuit 420 may include an inverter chain consisting of two or more inverters 411 and 421 connected in series.

A first switch element SW1 is connected between the first transmission pad 401 and the output terminal of the main driver 413, and a second switch element SW1 is connected between the second transmission pad 402 and the output terminal of the main driver 423. SW2) may be connected. The first switch element SW1 may be connected to the first buffer BF1, and the second switch element SW2 may be connected to the second buffer BF2. The first switch element SW1 may be turned on/off by the first selection signal SEL1, and the second switch element SW2 may be turned on/off by the second selection signal SEL2. The first buffer BF1 may output a first comparison signal CMP1, and the second buffer BF2 may output a second comparison signal CMP2. The core circuit of the semiconductor device 400 may output a first selection signal SEL1 and a second selection signal SEL2 and receive a first comparison signal CMP1 and a second comparison signal CMP2.

The core circuit of the semiconductor device 400 uses the first to fourth control signals (CTL1-CTL4) such that each of the first transmission pad 401 and the second transmission pad 402 may be set to output only a signal with a voltage level corresponding to digital "0" or digital "1". In this state, the switch elements SW1 and SW2 are turned on using the first selection signal SEL1 and the second selection signal SEL2, and by receiving the first comparison signal CMP1 and the second comparison signal CMP2, whether the first clock transmission circuit 410 and the second clock transmission circuit 420 are defective may be determined. Hereinafter, operation of semiconductor device 400 will be described in more detail with reference to FIGS. 12 and 13.

Figure 12:
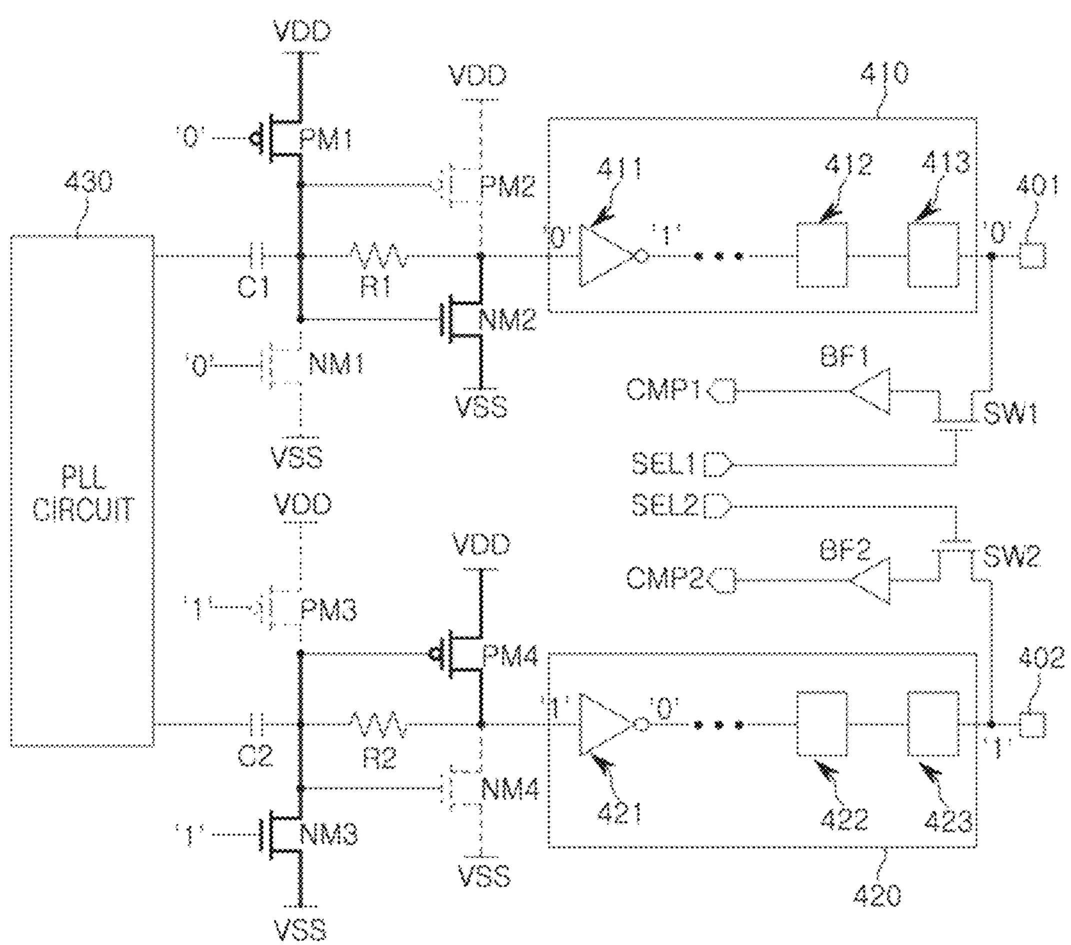
FIGS. 12 and 13 are diagrams illustrating a method of testing a semiconductor device according to an example embodiment.
Figure 13:
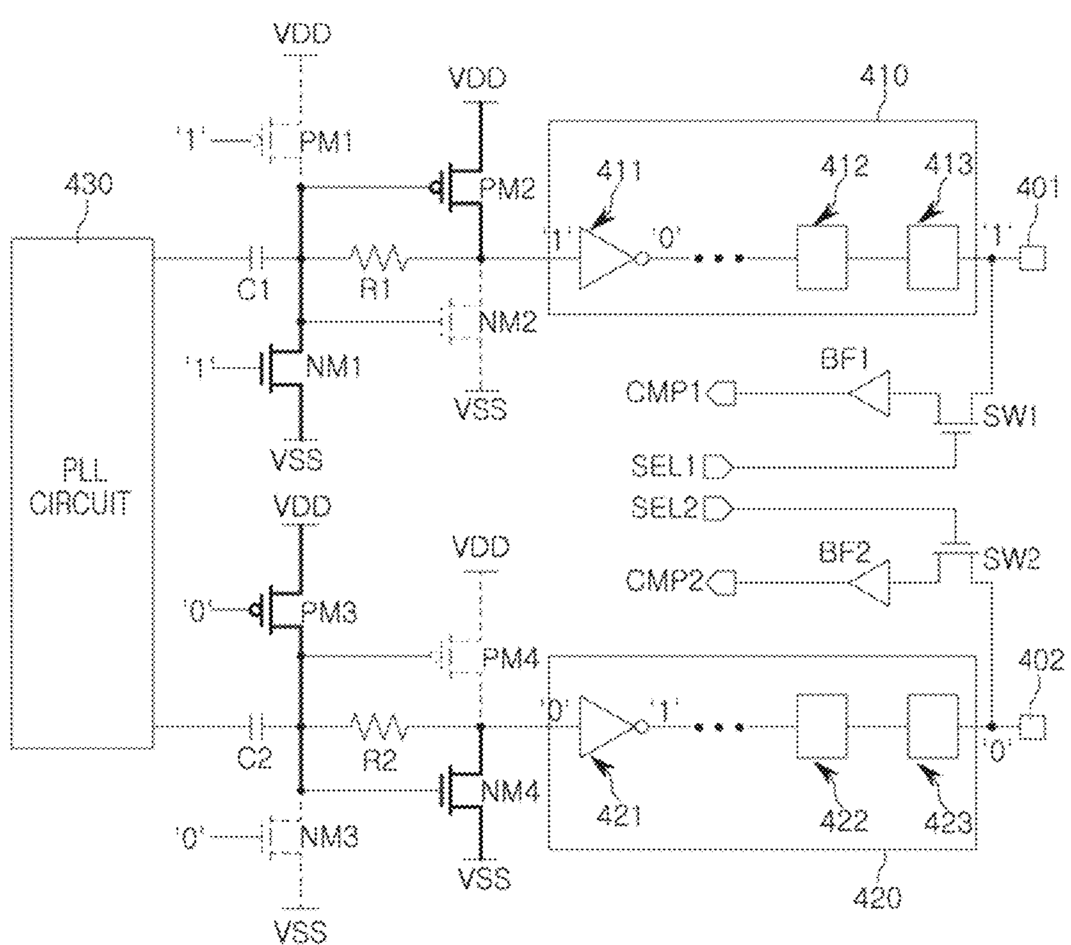

FIGS. 12 and 13 are drawings illustrating a method of testing a semiconductor device according to an example embodiment.

First, referring to FIG. 12, the core circuit sets the first control signal CTL1 and the second control signal CTL2 to "0" with the operation of the PLL circuit 430 stopped, and the third control signal CTL3 and the fourth control signal CTL4 may be set to "1". Therefore, as illustrated in FIG. 12, the first PMOS device PM1, the fourth PMOS device PM4, the second NMOS device NM2, and the third NMOS device NM3 may be turned on, and the second PMOS device PM2, the third PMOS device PM3, the first NMOS device NM1, and the fourth NMOS device NM4 may be turned off.

At the input terminal side of the first clock transmission circuit 410, a current path including the first PMOS element PM1, the second NMOS element NM2, and the first resistor element (R1) is formed to provide "0" to the inverter 411. "0" is input, and the voltage level of the signal output to the first transmission pad 401 may be determined depending on the number of inverters 411. In an example embodiment illustrated in FIG. 12, the number of inverters 411 may be even, and the first transmission pad 401 may have a voltage level corresponding to "0", for example, the first power supply voltage VSS, and a signal having a voltage level corresponding to "0" may be output.

On the other hand, on the input terminal side of the second clock transmission circuit 420, a current path including the fourth PMOS element PM4, the third NMOS element NM3, and the second resistor element (R2) is formed to transmit to the inverter 421. "1" is input, and the voltage level of the signal output to the second transmission pad 402 may be determined depending on the number of inverters 421. In an example embodiment illustrated in FIG. 12, a signal having a voltage level corresponding to "1", for example the second power supply voltage VDD, may be output to the second transmission pad 402.

The core circuit may turn on each of the first switch element SW1 and the second switch element SW2. Accordingly, the signal output to the first transmission pad 401 is fed back to the core circuit as the first comparison signal CMP1 through the first buffer BF1, and the signal output to the second transmission pad 402 may be fed back to the core circuit as the second comparison signal CMP2 through the second buffer BF2. The core circuit may be determined that the first clock transmission circuit 410 and the second clock transmission circuit 420 are normal, when the voltage level of the first comparison signal CMP1 is the first power supply voltage VSS and the voltage level of the second comparison signal CMP2 is the second power supply voltage VDD.

Next, referring to FIG. 13, the core circuit sets the first control signal CTL1 and the second control signal CTL2 to "1" with the operation of the PLL circuit 430 stopped, and the third control signal CTL3 and the fourth control signal CTL4 may be set to "0". Therefore, as illustrated in FIG. 13, the first PMOS device PM1, the fourth PMOS device PM4, the second NMOS device NM2, and the third NMOS device NM3 are turned off, and the second PMOS device PM2, the third PMOS device PM3, the first NMOS device NM1, and the fourth NMOS device NM4 may be turned on.

At the input terminal side of the first clock transmission circuit 410, a current path including the second PMOS element PM2, the first NMOS element NM1, and the first resistor element (R1) is formed to provide "1" to the inverter 411. A second power supply voltage VDD corresponding to "1" may be input. In an example embodiment illustrated in FIG. 13, a signal having a second power supply voltage VDD, which is a voltage level corresponding to "1", may be output to the first transmission pad 401.

On the other hand, on the input terminal side of the second clock transmission circuit 420, a current path including the third PMOS element PM3, the fourth NMOS element NM4, and the second resistor element (R2) is formed. The first power supply voltage VSS corresponding to digital "0" may be applied to the inverter 421. In an example embodiment illustrated in FIG. 13, a signal having a first power supply voltage VSS, which is a voltage level corresponding to digital "0", may be output to the second transmission pad 402.

The core circuit may turn on each of the first switch element SW1 and the second switch element SW2. Accordingly, the signal output to the first transmission pad 401 is fed back to the core circuit as the first comparison signal CMP1 through the first buffer BF1, and the signal output to the second transmission pad 402 may be fed back to the core circuit as the second comparison signal CMP2 through the second buffer BF2. When the voltage level of the first comparison signal CMP1 is the second power supply voltage VDD and the voltage level of the second comparison signal CMP2 is the first power supply voltage VSS, the core circuit may be determined that the first clock transmission circuit 410 and the second clock transmission circuit 420 are normal.

As described with reference to FIGS. 12 and 13, the semiconductor device 400 transmits the first clock transmission circuit 410 and the second clock even when the first transmission pad 401 and the second transmission pad 402 are floating. The transmission circuit 420 may be tested. The core circuit sets the PLL circuit 430 not to operate, and uses the control signals CTL1-CTL4 input to the DCC circuit to set the voltage of each of the first and second transmission pads 401 and 402 to a specific level. Therefore, even at the wafer level where the first transmission pad 401 and the second transmission pad 402 are not connected to a probe device, other semiconductor devices, or the like, the semiconductor device 400 may perform a self-test to verify whether the first clock transmission circuit 410 and the second clock transmission circuit 420 are defective.

On the other hand, in normal operation other than self-test, the core circuit sets the first control signal CTL1 and the third control signal CTL3 to "1", and may set the second control signal CTL2 and the fourth control signal CTL4 to "0". Accordingly, the first PMOS device PM1, the first NMOS device NM1, the third PMOS device PM3, and the third NMOS device NM3 may all be turned off.

Figure 14:
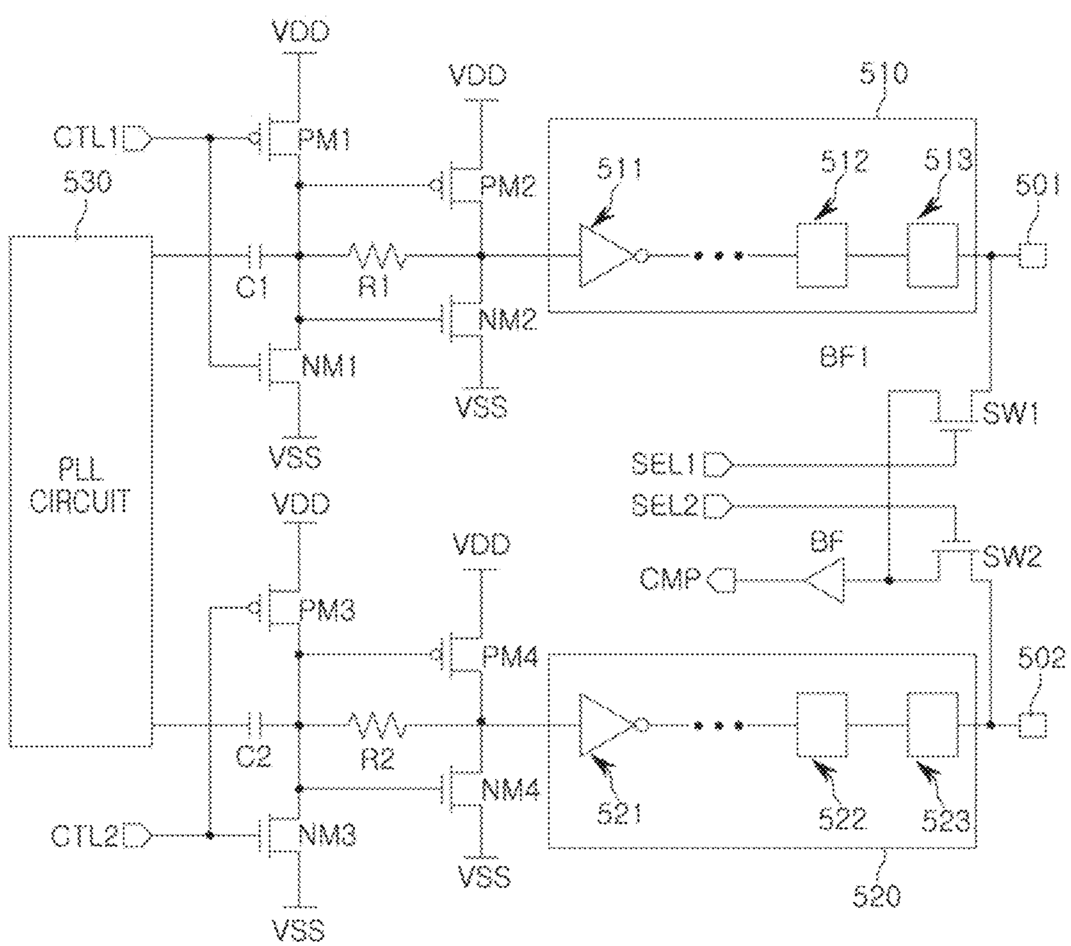
FIG. 14 is a diagram schematically illustrating a semiconductor device according to an example embodiment.

FIG. 14 is a diagram schematically illustrating a semiconductor device according to an example embodiment.

Referring to FIG. 14, the semiconductor device 500 according to an example embodiment may include a first clock transmission circuit 510, a second clock transmission circuit 520, and a PLL circuit 530. The first clock transmission circuit 510 and the second clock transmission circuit 520 may receive a clock signal from the PLL circuit 530 through a DCC circuit, and the configuration and operation of the DCC circuit may be similar to those previously described with reference to FIGS. 11 to 13.

In an example embodiment illustrated in FIG. 14, the first switch element SW1 connected to the first transmission pad 501 and the second switch element SW2 connected to the second transmission pad 502 may be commonly connected to one buffer BF. Accordingly, the number of switch elements SW1 and SW2 may be different from the number of buffers BF. The core circuit of the semiconductor device 500 alternately turns on the first switch element SW1 and the second switch element SW2 while testing at the wafer level, thereby verifying whether each of the first clock transmission circuit 510 and the second clock transmission circuit 520 is defective.

For example, as illustrated in FIG. 12, when the first control signal CTL1 is set to "0" and the second control signal CTL2 is set to "1", a signal having a first power supply voltage VSS may be output to the first transmission pad 501, and a signal having a second power supply voltage VDD may be output to the second transmission pad 502. The core circuit determines whether the comparison signal CMP is the first power supply voltage VSS with the first switch element SW1 turned on and the second switch element SW2 turned off, and the first clock transmission circuit 510 may be verified. In addition, the core circuit determines whether the comparison signal CMP is the second power supply voltage VDD with the first switch element SW1 turned off and the second switch element SW2 turned on. 2 The clock transmission circuit 520 may thus be verified.

Figure 15:
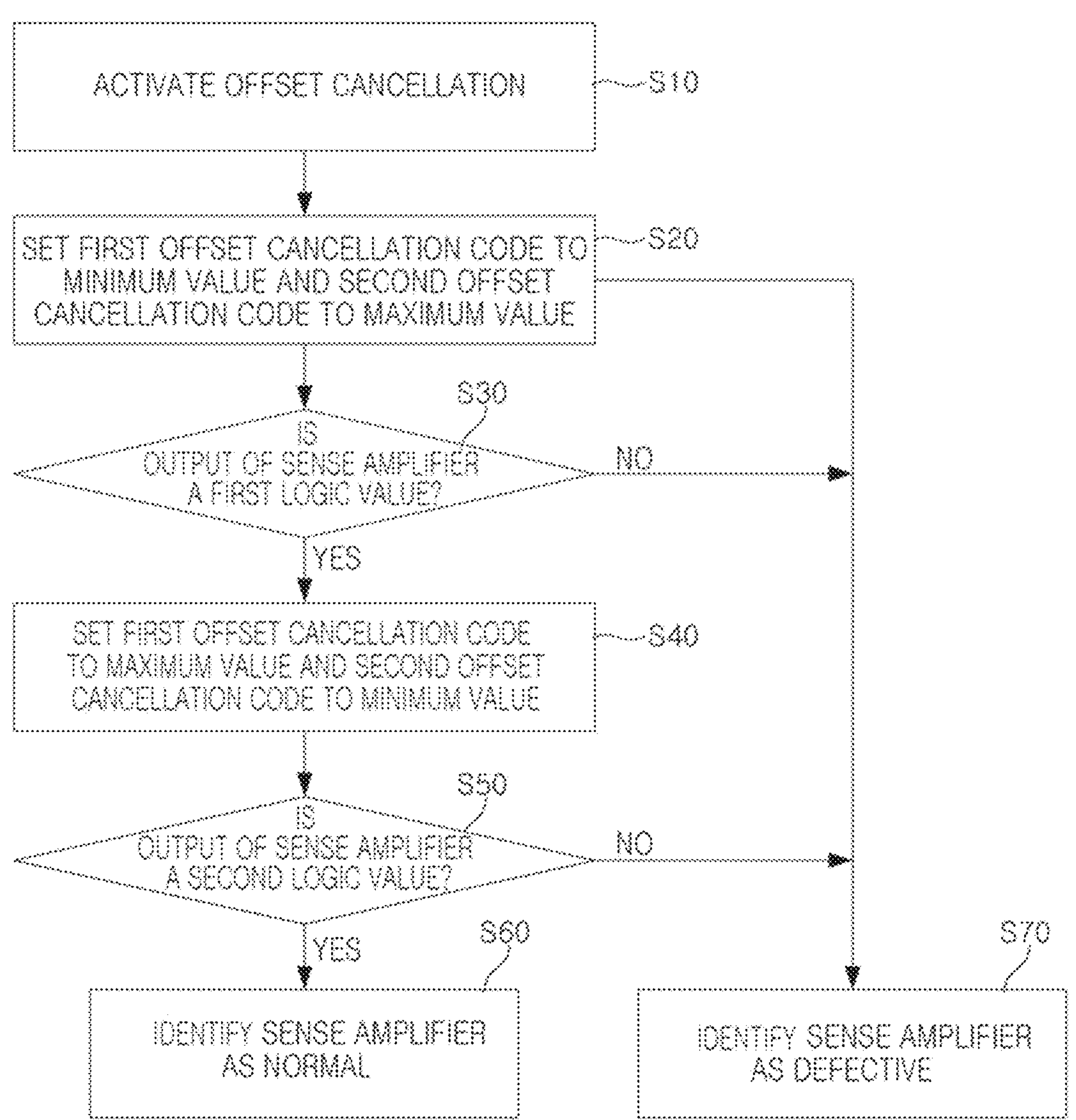
FIG. 15 is a flowchart illustrating a method of testing a semiconductor device according to an example embodiment.

FIG. 15 is a flowchart illustrating a testing method of a semiconductor device according to an example embodiment.

FIG. 15 is a flowchart schematically illustrating a test method of verifying whether a reception circuit included in a semiconductor device and receiving a signal from another external device is operating normally. Referring to FIG. 15, the test method according to an example embodiment may begin with the core circuit of the semiconductor device activating the offset cancellation function of the sense amplifier included in the reception circuit (S10).

When the offset cancel function is activated, the core circuit may set the output of the sense amplifier to be maintained at a specific logic value using the first offset cancellation code and the second offset cancellation code. For example, the core circuit may first set the first offset cancellation code to the minimum value and set the second offset cancellation code to the maximum value (S20). In this state, the core circuit may determine whether the output of the sense amplifier is maintained at the first logic value (S30).

When one of the offset cancellation codes input to the sense amplifier is set to the minimum value and the other one is set to the maximum value, the output voltage of the sense amplifier where there is no defect may be maintained at a level corresponding to "0" or a level corresponding to "1". Therefore, after setting the first and second offset cancellation codes as in step S20, the core circuit determines that the sense amplifier is defective if the output voltage of the sense amplifier is not maintained at the level corresponding to the first logic value (S70).

If the output voltage of the sense amplifier is maintained at a level corresponding to the first logic value in step S30, the core circuit may set the first offset cancellation code to the maximum value and the second offset cancellation code to the minimum value (S40). If there is no defect in the sense amplifier, the first and second offset cancellation codes are set oppositely compared to step S20, and thus the output voltage of the sense amplifier may be changed to a level corresponding to the second logic value. Accordingly, the core circuit may determine whether the output of the sense amplifier is maintained at the second logic value (S50) and verify whether the sense amplifier is defective based on the result.

If the output of the sense amplifier is maintained at the second logic value in step S50, the core circuit may determine that the sense amplifier is normal (S60). On the other hand, if the output voltage of the sense amplifier is not maintained at the level corresponding to the second logic value in step S50, the core circuit may determine that the sense amplifier is defective (S70).

Figure 16:
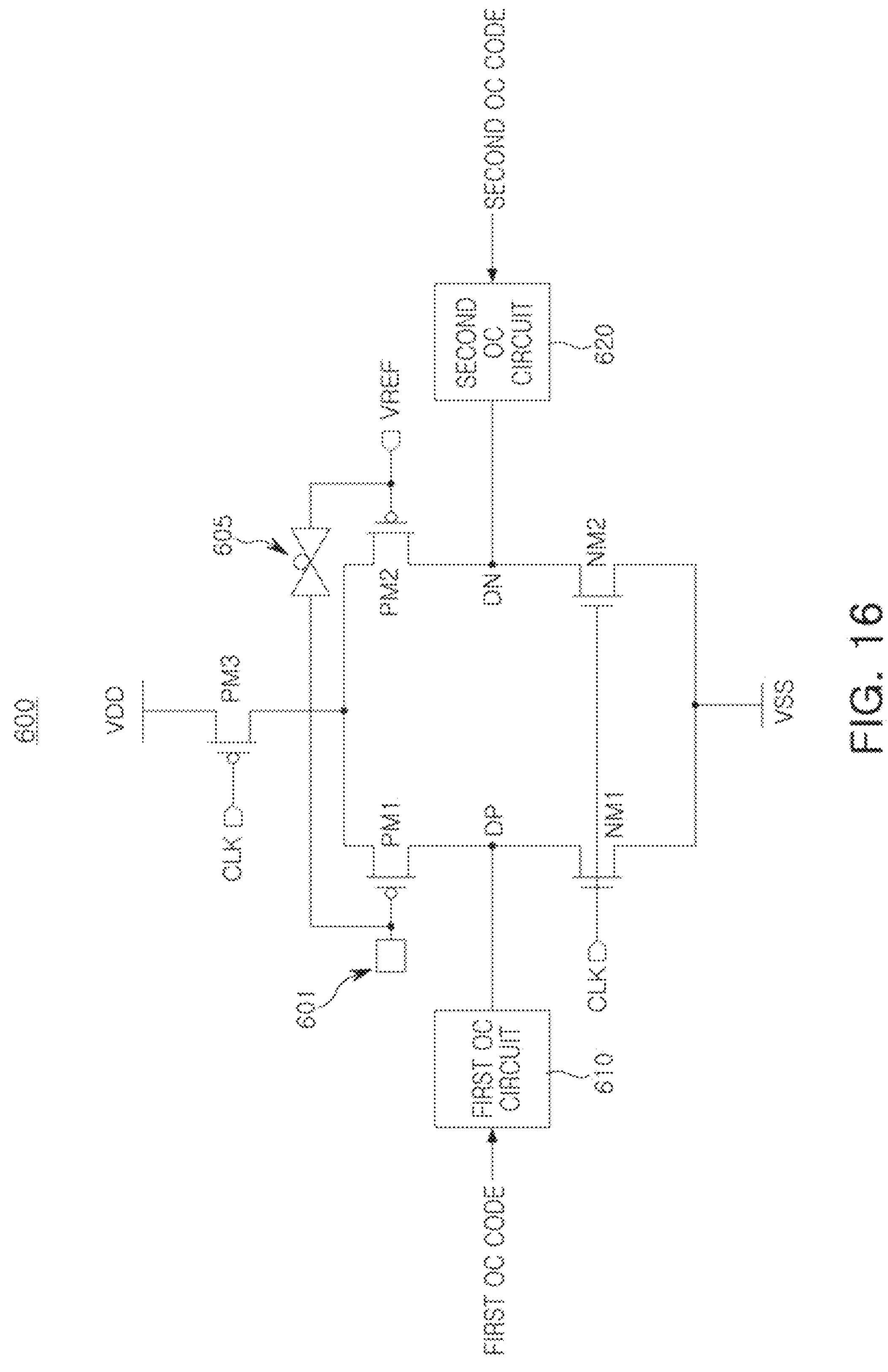
FIGS. 16 and 17 are schematic diagrams of a semiconductor device according to an example embodiment.
Figure 17:
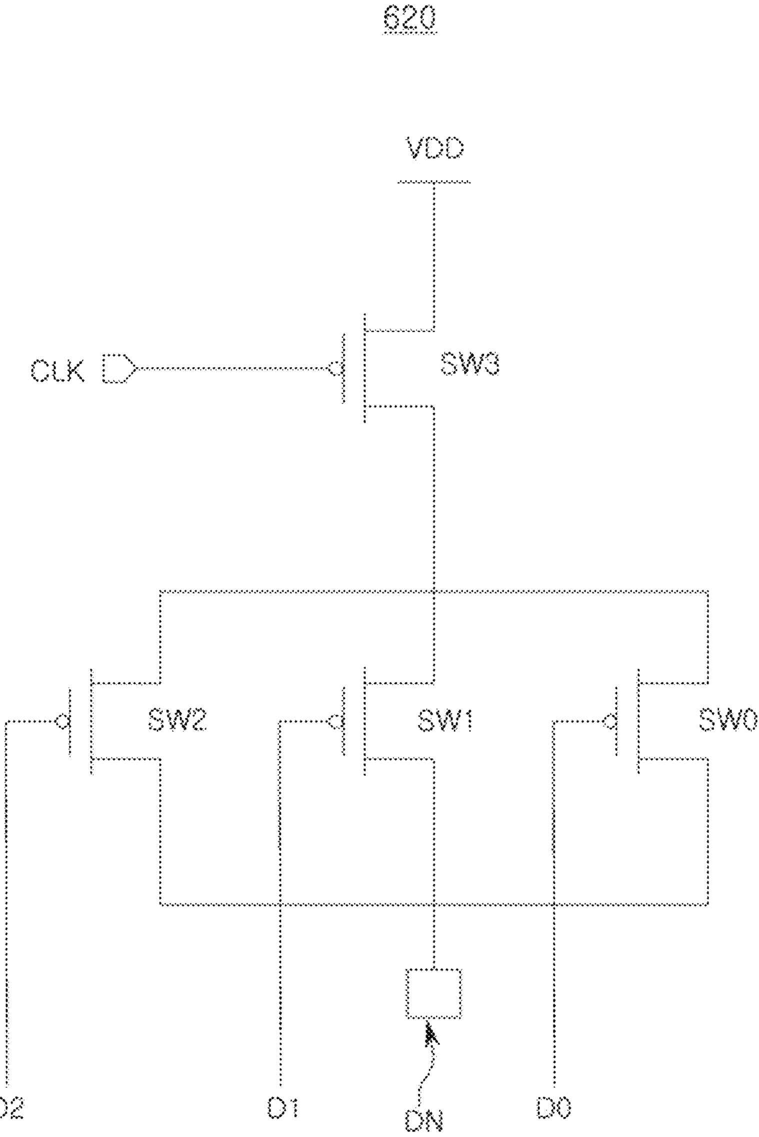

FIGS. 16 and 17 are schematic diagrams of a semiconductor device according to an example embodiment.

FIG. 16 is a circuit diagram schematically illustrating a sense amplifier connected to a reception pad 601 that receives a data signal in a semiconductor device 600 according to an example embodiment. Referring to FIG. 16, the sense amplifier includes first to third PMOS elements PM1-PM3, first and second NMOS elements NM1 and NM2, an offset cancellation switch 605, a first offset cancellation circuit 610, a second offset cancellation circuit 620, and the like. However, the structure of the sense amplifier may be modified in various ways depending on an example embodiment.

The gate of the first PMOS device PM1 is connected to the reception pad 601, and the gate of the second PMOS device PM2 may receive the reference voltage VREF. The gate of the first PMOS device PM1 may provide a first input terminal of the sense amplifier, and the gate of the second PMOS device PM2 may provide a second input terminal. On the other hand, the gates of each of the first and second NMOS elements NM1 and NM2 may receive a clock signal CLK. In normal operation of receiving data signals, the sense amplifier may output an output signal determined as a result of comparison between the data signal input to the reception pad 601 and the reference voltage VREF for each rising edge and/or falling edge of the clock signal CLK.

The first offset cancellation circuit 610 may be connected to the first output node DP, and the second offset cancellation circuit 620 may be connected to the second output node DN. However, depending on an example embodiment, the offset cancellation circuit may be connected to only one of the output terminals DP and DN of the sense amplifier. The first offset cancellation circuit 610 may receive a first offset cancellation code and operate, and the second offset cancellation circuit 620 may receive a second offset cancellation code and operate. Prior to the offset cancel operation, the offset cancellation switch 605 may be turned on. Each of the first offset cancellation code and the second offset cancellation code may be N bits of data (where N is a natural number of 2 or more), and the number of bits of the first offset cancellation code may be the same as the number of bits of the second offset cancellation code.

In an example embodiment, a determination of whether the sense amplifier is defective may be obtained using the offset cancellation operation of the sense amplifier. At the wafer level, before the semiconductor device 600 is connected to another semiconductor device or mounted on a substrate, the reception pad 601 remains floating, and therefore the reception pad 601 is small in size and cannot be contacted with a probe device. Otherwise, a determination of whether the sense amplifier is operating normally at the wafer level may not be verified. In an example embodiment, defects in the sense amplifier may be verified by forcibly setting the output of the sense amplifier to “0” or “1” using the offset cancellation operation of the sense amplifier.

At the wafer level, the core circuit of the semiconductor device 600 turns on the offset cancellation switch 605, and in response, the reference voltage VREF may be input to the reception pad 601. In this state, the first offset cancellation code may be set to the maximum value, and the second offset cancellation code may be set to the minimum value. For example, if each of the first offset cancellation code and the second offset cancellation code is 3 bits of data, the first offset cancellation code may be set to “111” and the second offset cancellation code may be set to “000”. By setting the offset cancellation code like this, the output of the sense amplifier may be fixed to “1”. The core circuit turns on the offset cancellation switch 605, and with the first offset cancellation code set to “111” and the second offset cancellation code set to “000”, the sense amplifier may be tested by determining whether the output of the sense amplifier is “1”.

On the other hand, the core circuit may set the first offset cancellation code to the minimum value and the second offset cancellation code to the maximum value with the offset cancellation switch 605 turned on. For example, when each of the first offset cancellation code and the second offset cancellation code is 3 bits of data, the first offset cancellation code may be set to “000” and the second offset cancellation code may be set to “111”. By setting the offset cancellation code like this, the output of the sense amplifier is fixed to “0”, and the core circuit may test the sense amplifier by determining whether the output of the sense amplifier is “0”.

FIG. 17 may be a circuit diagram schematically illustrating the second offset cancellation circuit 620 included in the sense amplifier. Referring to FIG. 17, the second offset cancellation circuit 620 may include first to third switch elements SW0-SW2 connected in parallel with each other, and a fourth switch element SW3 receiving the first power voltage VDD. The fourth switch element SW3 is turned on/off by the clock signal CLK, and each of the first to third switch elements SW0-SW2 may be turned on/off by the bits D0-D2 included in the second offset cancellation code. FIG. 16 may be an example embodiment assuming that the second offset cancellation code is 3-bit data.

When the second offset cancellation code is “000”, all of the first to third switch elements SW0-SW2 are turned on and current may be supplied to the second output node DN. In this state, when the first offset cancellation code is set to “111” and the offset cancellation switch 605 is turned on, and a second power supply voltage VDD corresponding to “1” may be output to the second output node DN of the sense amplifier. On the other hand, when the second offset cancellation code is “111”, all first to third switch elements SW0-SW2 are turned off, the first power supply voltage VSS corresponding to “1” may be output to the second output node DN.

Figure 18:
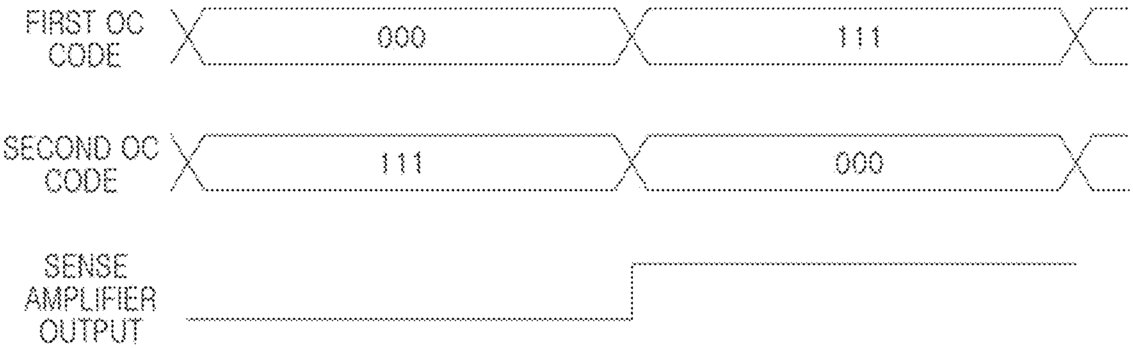
FIG. 18 is a diagram illustrating the operation of a semiconductor device according to an example embodiment.

FIG. 18 is a diagram illustrating the operation of a semiconductor device according to an example embodiment.

In FIG. 18, the first offset cancellation (OC) code is a code input to the first offset cancellation circuit 610, as previously described with reference to FIG. 16, and the second OC code may be a code input to the second offset cancellation circuit 620. In an example embodiment illustrated in FIG. 18, it is assumed that each of the first offset cancellation code and the second offset cancellation code is a 3-bit code, but it is not necessarily limited to this form. For example, the first offset cancellation code and the second offset cancellation code, which are 3-bit codes, may be input bit by bit to respective gates of the three switch elements SW0-SW2 connected in parallel as in an example embodiment illustrated in FIG. 17.

First, when the first offset cancellation code is set to "000" and the second offset cancellation code is set to "111", the switch elements SW0-SW2 may be turned on in the first offset cancellation circuit 610 and the switch elements SW0-SW2 may be turned off in the second offset cancellation circuit 620. Accordingly, the voltage of the second output node DN, which is the output of the sense amplifier, may be maintained at a voltage corresponding to "0". In this state, the core circuit of the semiconductor device 600 may verify whether the sense amplifier is defective by determining whether the output of the sense amplifier is a voltage corresponding to "0".

Next, when the first offset cancellation code is set to "111" and the second offset cancellation code is set to "000", the switch elements (SW0-SW2) in the first offset cancellation circuit 610 are turned off. In the second offset cancellation circuit 620, the switch elements SW0-SW2 may be turned on. Accordingly, the voltage of the second output node DN, which is the output of the sense amplifier, may increase to the voltage corresponding to "1". The core circuit of the semiconductor device 600 maintains the output of the sense amplifier at a voltage corresponding to "1" while the first offset cancellation code is maintained at "111" and the second offset cancellation code is maintained at "000". By detecting whether the sense amplifier is defective, it may be determined whether the sense amplifier is defective.

As set forth above, according to an example embodiment, by connecting a buffer between the transmission pad and the output terminal of the transmission circuit outputting a data signal and/or a clock signal, tests may be performed up to analog circuits outputting signals externally without separate probing by a method of inputting power and commands to the test pad at a wafer level. Therefore, defects in the semiconductor device may be determined in advance before packaging work, and the yield of semiconductor packages may be improved and manufacturing costs of the semiconductor package may be reduced.

While example embodiments have been illustrated and described above, it will be apparent to those skilled in the art that modifications and variations could be made without departing from the scope of the present disclosure as defined by the appended claims.

What is claimed is:

1. A semiconductor device comprising:

a first transmission pad configured to output a data signal;

a second transmission pad configured to output a clock signal;

a data transmission circuit connected to the first transmission pad and comprising a data driver configured to generate the data signal;

a clock transmission circuit connected to the second transmission pad and comprising a clock driver configured to generate the clock signal;

a core circuit configured to control the data driver and the clock driver;

at least one buffer, wherein each buffer of the at least one buffer comprises:

an input terminal connected to at least one of an output terminal of the data driver and an output terminal of the clock driver; and an output terminal connected to the core circuit; and at least one switch element connected between the output terminal of the data driver or the output terminal of the clock driver and a corresponding one of the first transmission pad and the second transmission pad, wherein the input terminal of the at least one buffer is connected to the at least one switch element.

2. The semiconductor device of claim 1, further comprising a switch element connected between the input terminal of the at least one buffer and at least one of the output terminal of the data driver and the output terminal of the clock driver.

3. The semiconductor device of claim 2, further comprising a plurality of switch elements including the switch element, wherein the plurality of switch elements is equal in number to a number of the at least one buffer.

4. The semiconductor device of claim 2, further comprising a plurality of switch elements including the switch element, wherein the plurality of switch elements is different from a number of the at least one buffer.

5. The semiconductor device of claim 1, wherein the at least one buffer comprises a first buffer connected to the output terminal of the data driver, and a second buffer connected to the output terminal of the clock driver.

6. The semiconductor device of claim 5, further comprising:

a first switch element connected between the input terminal of the first buffer and the output terminal of the data driver, and a second switch element connected between the input terminal of the second buffer and the output terminal of the clock driver.

7. The semiconductor device of claim 5, wherein the core circuit is further configured to:

control the data driver to continuously output a voltage corresponding to digital 0 or a voltage corresponding to digital 1 during a predetermined first test time, and verify the data transmission circuit using an output of the first buffer during the predetermined first test time.

8. The semiconductor device of claim 5, wherein the core circuit is further configured to:

control the clock driver to continuously output a voltage corresponding to digital 0 or a voltage corresponding to digital 1 during a predetermined second test time, and verify the clock transmission circuit using an output of the second buffer during the predetermined second test time.

9. The semiconductor device of claim 8, wherein the clock transmission circuit further comprises a Duty Cycle Correction (DCC) circuit connected between the clock driver and a Phase Locked Loop (PLL) circuit, wherein the PLL circuit is configured to generate an internal clock signal corresponding to the clock signal, wherein the DCC circuit is configured to adjust a duty ratio of the internal clock signal, and wherein the core circuit is further configured to stop an operation of the PLL circuit during the predetermined second test time and to control the clock driver to continuously output a voltage corresponding to digital 0 or a voltage corresponding to digital 1 using the DCC circuit.

10. The semiconductor device of claim 1, further comprising:

a reception pad exposed externally and configured to receive an external signal; and a sense amplifier comprising a first input terminal connected to the reception pad and a second input terminal configured to receive a predetermined reference voltage, wherein the core circuit is further configured to verify the sense amplifier by adjusting an offset cancellation code input to the sense amplifier while activating an offset cancellation function of the sense amplifier.

11. The semiconductor device of claim 10, wherein the core circuit is further configured to:

verify the sense amplifier by inputting a first offset cancellation code and a second offset cancellation code to the sense amplifier, setting the first offset cancellation code to a minimum value and setting the second offset cancellation code to a maximum value, and setting the first offset cancellation code to a maximum value and setting the second offset cancellation code to a minimum value.

12. The semiconductor device of claim 11, wherein the core circuit is further configured to:

based on identifying that an output of the sense amplifier is fixed to a voltage corresponding to digital 0 while the first offset cancellation code is set to the minimum value and the second offset cancellation code is set to the maximum value, verify the sense amplifier as normal, and based on identifying that the output of the sense amplifier is fixed to a voltage corresponding to digital 1 while the first offset cancellation code is set to the maximum value and the second offset cancellation code is set to the minimum value, verify the sense amplifier as detective.

13. The semiconductor device of claim 11, wherein each of the first offset cancellation code and the second offset cancellation code comprise a code of N bits, where N is a natural number greater than or equal to 2.

14. A semiconductor package comprising:

a first semiconductor device comprising a first transmission pad configured to output a data signal and a second transmission pad configured to output a clock signal;

a second semiconductor device comprising a first reception pad configured to receive the data signal and a second reception pad configured to receive the clock signal;

an intermediate substrate on which the first semiconductor device and the second semiconductor device are mounted, wherein the intermediate substrate comprises a redistribution pattern connecting the first transmission pad with the first reception pad and connecting the second transmission pad with the second reception pad; and a package substrate on which the intermediate substrate is mounted, wherein the first semiconductor device comprises:

a first switch element connected between an output terminal of a data driver configured to output the data signal and the first transmission pad; and a first buffer connected to the first switch element.

15. The semiconductor package of claim 14, wherein the first semiconductor device further comprises:

a second switch element connected between an output terminal of a clock driver configured to output the clock signal and the second transmission pad; and a second buffer connected to the second switch element and implemented separately from the first buffer.

16. The semiconductor package of claim 14, wherein the first semiconductor device further comprises a second switch element connected between an output terminal of a clock driver configured to output the clock signal and the second transmission pad, and wherein the second switch element is connected to the first buffer.

17. The semiconductor package of claim 14, further comprising:

a plurality of microbumps in contact with the first semiconductor device, the second semiconductor device, and an upper surface of the intermediate substrate, wherein the first semiconductor device and the second semiconductor device are mounted on the upper surface of the intermediate substrate via the plurality of microbumps; and a plurality of bumps in contact with the intermediate substrate and an upper surface of the package substrate, wherein the intermediate substrate is mounted on the upper surface of the package substrate via the plurality of bumps, wherein each of the plurality of microbumps comprises a diameter of 50 micrometers or less.

18. A semiconductor device comprising:

a reception pad configured to receive a data signal;

a sense amplifier comprising a first input terminal connected to the reception pad, a second input terminal configured to receive a predetermined reference voltage, an offset cancellation switch connected between the first input terminal and the second input terminal, and an offset cancellation circuit connected to at least one of the first input terminal and the second input terminal; and a core circuit configured to:

control the offset cancellation switch, control the offset cancellation circuit to output a first offset cancellation code and a second offset cancellation code, turn on the offset cancellation switch with the reception pad in a floating state, set one of the first offset cancellation code and the second offset cancellation code to a maximum value and set the other one of the first offset cancellation code and the second offset cancellation code to a minimum value, and identify whether the sense amplifier is defective.

19. The semiconductor device of claim 18, wherein the core circuit is further configured to:

identify that the sense amplifier is not defective based on an output voltage of the sense amplifier being maintained at a first level while the first offset cancellation code is set to the minimum value and the second offset cancellation code is set to the maximum value and the output voltage of the sense amplifier being maintained at a second level different from the first level while the first offset cancellation code is set to the maximum value and the second offset cancellation code is set to the minimum value.

20. The semiconductor device of claim 19, wherein the first level is a level of a first power supply voltage input to the sense amplifier, and the second level is a level of a second power supply voltage input to the sense amplifier, wherein the second level is greater than the first level.

* * * * *